US012575034B2

(12) United States Patent
Suhaimi et al.

(10) Patent No.: US 12,575,034 B2
(45) Date of Patent: Mar. 10, 2026

(54) REWORK PATCH FOR AN ELECTRONIC CIRCUIT

(71) Applicant: Jabil Inc., St. Petersburg, FL (US)

(72) Inventors: Muhammad Irsyad Bin Suhaimi, Bayan Lepas (MY); Lai Ming Lim, Bukit Mertajam (MY); Zambri Samsudin, Gelugor (MY)

(73) Assignee: Jabil Inc., St. Petersburg, FL (US)

( * ) Notice: Subject to any disclaimer, the term of this patent is extended or adjusted under 35 U.S.C. 154(b) by 78 days.

(21) Appl. No.: 18/319,870

(22) Filed: May 18, 2023

(65) Prior Publication Data

US 2024/0040706 A1     Feb. 1, 2024

(30) Foreign Application Priority Data

Jul. 28, 2022    (MY) .......................... UI 2022004042

(51) Int. Cl.
| | |
|---|---|
| *H05K 3/22* | (2006.01) |
| *H05K 1/11* | (2006.01) |
| *H05K 3/303* | (2026.01) |
| *H05K 3/32* | (2006.01) |
| *H05K 1/181* | (2026.01) |

(52) U.S. Cl.
CPC ............. *H05K 3/225* (2013.01); *H05K 1/111* (2013.01); *H05K 3/305* (2013.01); *H05K 3/32* (2013.01); *H05K 1/181* (2013.01); *H05K 2203/068* (2013.01); *H05K 2203/176* (2013.01)

(58) Field of Classification Search
CPC ....................................................... H05K 3/225
USPC ........................................................... 174/255
See application file for complete search history.

(56) References Cited

U.S. PATENT DOCUMENTS

| | | | | |
|---|---|---|---|---|
| 4,438,561 A * | 3/1984 | Mueller | ................. | H05K 3/225 |
| | | | | 29/846 |
| 4,704,304 A * | 11/1987 | Amendola | ............. | H05K 3/225 |
| | | | | 427/140 |
| 6,840,428 B2 | 1/2005 | Wong et al. | | |
| 2004/0168912 A1* | 9/2004 | Klemic | ................. | C12M 35/02 |
| | | | | 264/138 |
| 2009/0126974 A1* | 5/2009 | Yuasa | ................... | B29C 70/506 |
| | | | | 174/250 |
| 2020/0367358 A1* | 11/2020 | Hatch | ................... | H05K 3/225 |

FOREIGN PATENT DOCUMENTS

| | | |
|---|---|---|
| CN | 102036480 B | 7/2012 |

* cited by examiner

*Primary Examiner* — Stanley Tso
(74) *Attorney, Agent, or Firm* — Young Basile Hanlon & MacFarlane, P.C.

(57)     ABSTRACT

A rework patch for an electronic circuit includes a flexible patch body and at least two patch traces. The electronic circuit includes a substrate, at least two board traces formed on the substrate, and at least one defect portion within at least one of the board traces. The patch body is attached to the substrate to partially cover each of the board traces and to cover the defect portion. The patch traces are formed on the patch body. A pattern of the patch traces corresponds to a pattern of a portion of the board traces covered by the patch body.

15 Claims, 6 Drawing Sheets

REWORK PATCH FOR AN ELECTRONIC CIRCUIT

CROSS-REFERENCE TO RELATED APPLICATION

This application claims priority to Malaysia Utility Innovation Application No. UI 2022004042, filed on Jul. 28, 2022.

FIELD

The disclosure relates to a patch, and more particularly to a rework patch for an electronic circuit.

BACKGROUND

Flexible and stretchable printed electronics exhibit excellent conformability to nonplanar surfaces, and have potential applications in wearable electronics, flexible display and biosensors.

A flexible or stretchable electronic circuit includes a flexible or stretchable substrate, a plurality of board traces that are formed by printing conductive ink onto the substrate, and at least one surface-mounted electronic component that is electrically connected to the board traces. An electrically conductive adhesive (ECA) is used to introduce an electrical connection between the surface-mounted electronic component and the board traces. Once the ECA is cured, the surface-mounted electronic component is interconnected with the board traces, and a permanent physical connection is then established therebetween. However, demounting the surface-mounted electronic component from the substrate will crack the board traces, which will lead to an open circuit. The electronic circuit will not function even if a new surface-mounted electronic component is mounted onto the cracked board traces.

SUMMARY

Therefore, an object of the disclosure is to provide a rework patch that can alleviate the drawback of the prior art.

According to the disclosure, the rework patch is adapted for a rework process of an electronic circuit. The electronic circuit includes a substrate, at least two spaced-apart board traces that are formed on the substrate, and at least one defect portion within at least one of the board traces. The rework patch includes a flexible patch body and at least two spaced-apart patch traces. The patch body is adapted to be attached to the substrate to partially cover each of the board traces and to cover the defect portion. The patch traces are formed on the patch body. A pattern of the patch traces corresponds to a pattern of a portion of the board traces covered by the patch body.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
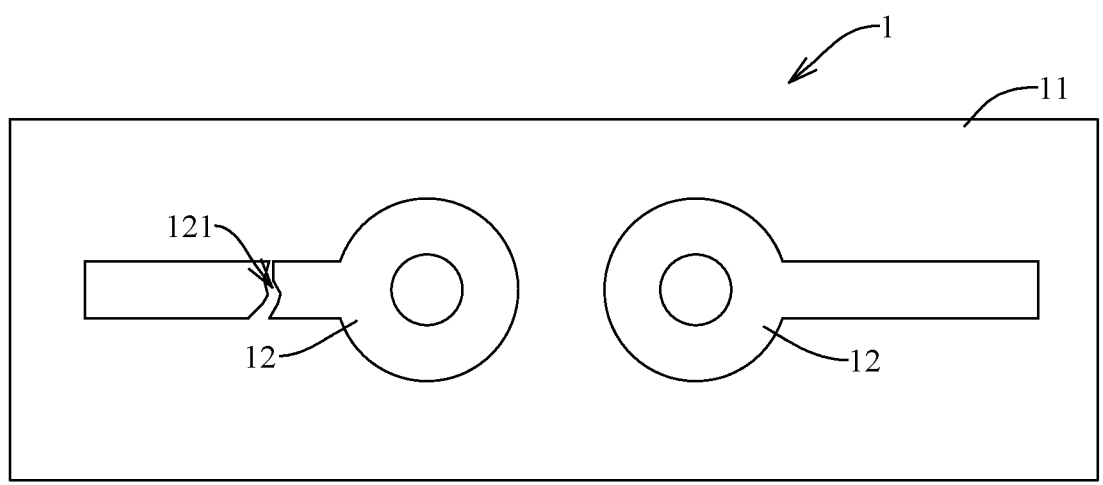
FIG. 1 is a top view illustrating a substrate with defective board traces.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a flexible electronic circuit 1 includes a flexible substrate 11, a plurality of spaced-apart board traces 12 formed on the substrate 11, and at least one surface-mounted electronic component (not shown) that is electrically coupled to the board traces 12 by an electrically conductive adhesive (ECA). The board traces 12 may be formed by printing flexible or stretchable conductive ink on the substrate 11.

A rework process may be performed when the electronic component is to be replaced or when the electronic circuit 1 experiences defects such as broken traces, design flaws or component failure. In the rework process, the electronic component is first removed from the substrate 11, and then a residual electrically conductive adhesive is cleaned by using a cleaning agent/solvent. At least one defect portion 121 may be formed in at least one of the board traces 12 during or before the step of removing the electronic component from the substrate 11 in the rework process.

Figure 2:
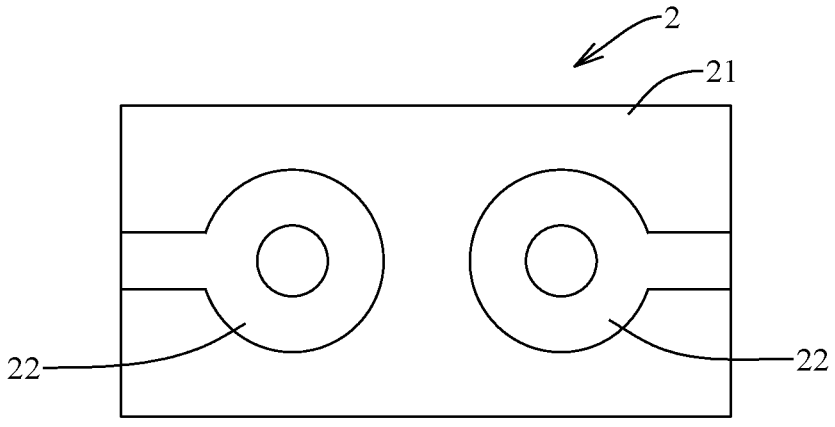
FIG. 2 is a top view illustrating an embodiment of the rework patch according to the disclosure.

Referring to FIG. 2, an embodiment of the rework patch 2 according to the disclosure includes a flexible patch body 21, and a plurality of spaced-apart patch traces 22 formed on the patch body. In one embodiment, the patch body 21 is stretchable so as to be flexible. In one embodiment, the patch body 21 may be made of an ultraviolet (UV) acrylic hotmelt adhesive, flexible and/or stretchable Polydimethylsiloxane (PDMs), Silicon, or urethane based substrate. The patch traces 22 may be screen printed/dispensed onto the patch body 21.

Figure 3:
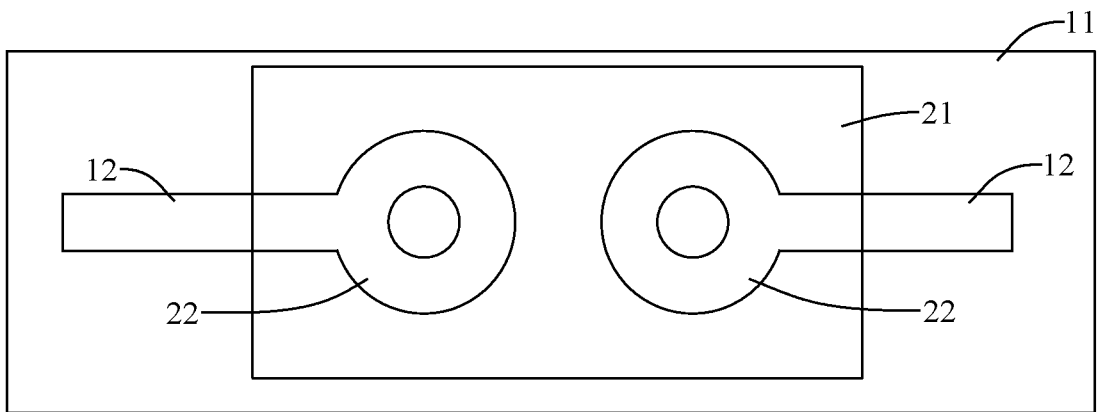
FIG. 3 is a top view illustrating the rework patch covering the defective board traces.

Referring to FIG. 3, in the rework process, after the residual electrically conductive adhesive is cleaned, the rework patch 2 is then laminated on the substrate 11 to partially cover each of the board traces 12 and to cover the defect portion 121, which prevents the defect portion 121 from being exposed to high temperature. In some embodiments, the rework patch 2 is laminated on the substrate 11 by using an infrared (IR) localized heater, a localized heater or a customized mini heat press. A pattern of the patch traces 22 corresponds to a pattern of a portion of the board traces 12 covered by the patch body 21. In one embodiment, the pattern of the patch traces 22 is nearly identical to the pattern of the portion of the board traces 12 covered by the patch body 21, except the defect portion 121.

Figure 4:
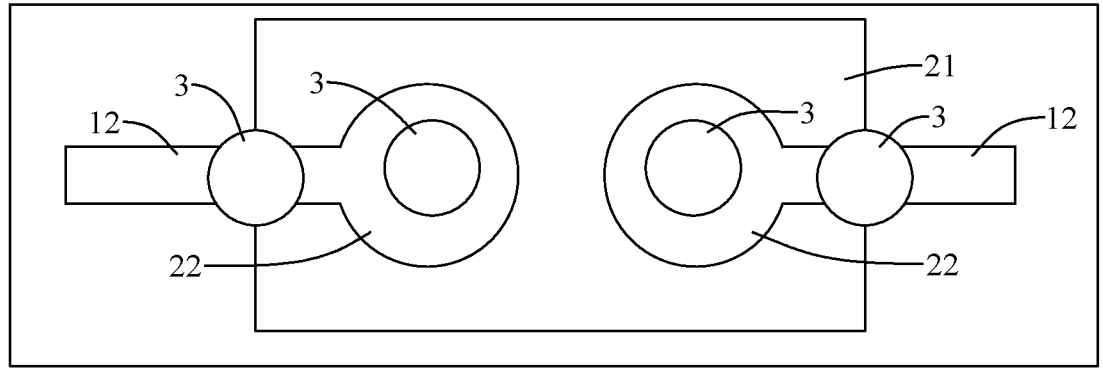
FIG. 4 is a top view illustrating a plurality of conductive lumps being dispensed on the rework patch.
Figure 5:
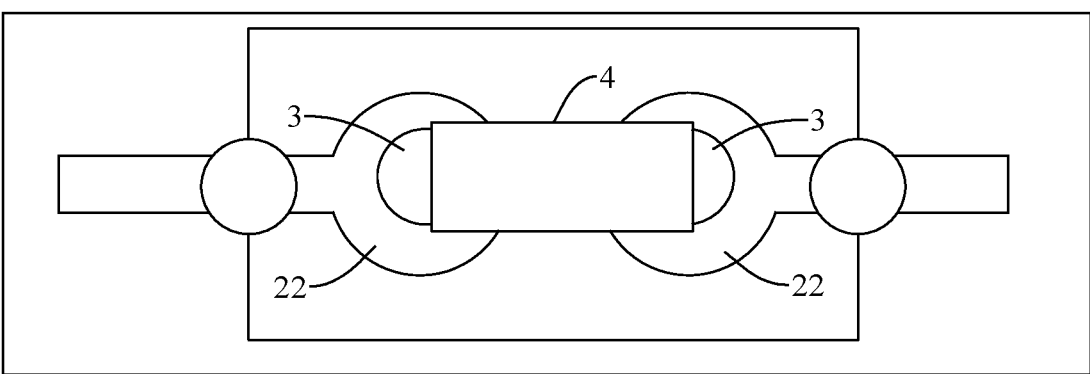
FIG. 5 is a top view illustrating a surface-mounted electronic component being mounted on the rework patch.

Referring to FIG. 4, a plurality of stretchable conductive lumps 3 are dispensed on a periphery of the patch body 21 to establish an electrical connection between each of the patch traces 22 and a respective one of the board traces 12. In certain embodiments, additional conductive lumps 3 may be respectively dispensed on the patch traces 22 at proper positions for a replacement electronic component 4 (see FIG. 5) to be mounted thereto, so as to finish the rework process.

By virtue of the rework patch 2 according to the disclosure, the substrate 11 can easily be reused after an original electronic component is removed. Therefore, the cost of procuring direct and indirect materials, such as the substrate 11 and/or the conductive ink for forming the board traces 12, may be reduced, and the total cost for assembling the entire flexible electronic circuit 1 may be reduced. In addition, by virtue of the configuration of the patch traces 22, the replacement electronic component 4 may easily be mounted to the rework patch 2 so as to be electrically connected to the patch traces 22.

Figure 6:
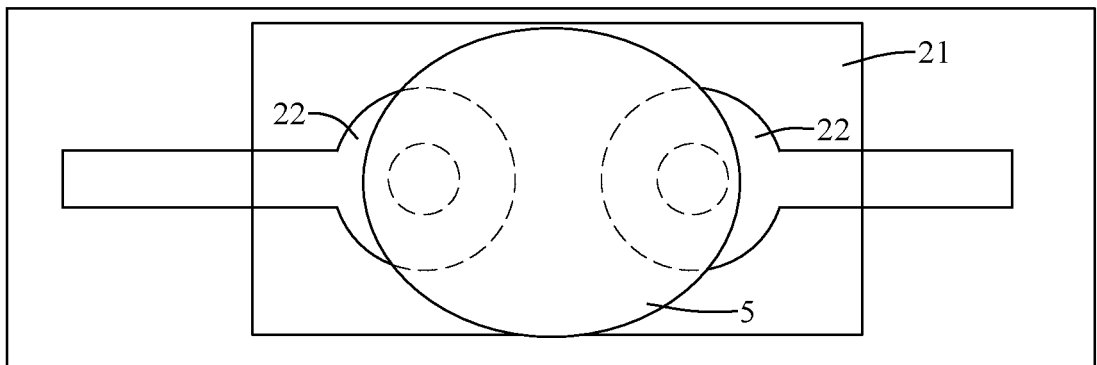
FIG. 6 is a top view illustrating a non-conductive adhesive being dispensed on the rework patch.
Figure 7:
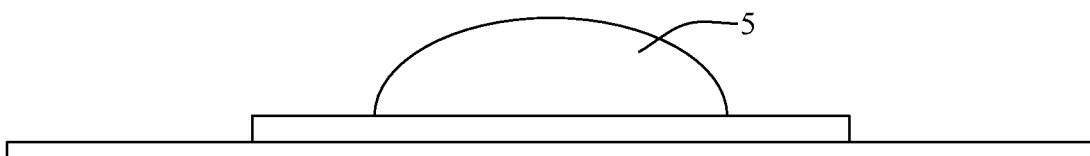
FIG. 7 is a side view illustrating the non-conductive adhesive being dispensed on the rework patch.

Referring to FIGS. 6 and 7, in an alternative rework process, a non-conductive adhesive (NCA) 5 is dispensed on the rework patch 2 to partially cover the patch traces 22 after the rework patch 2 is laminated on the substrate 11.

Figure 8:
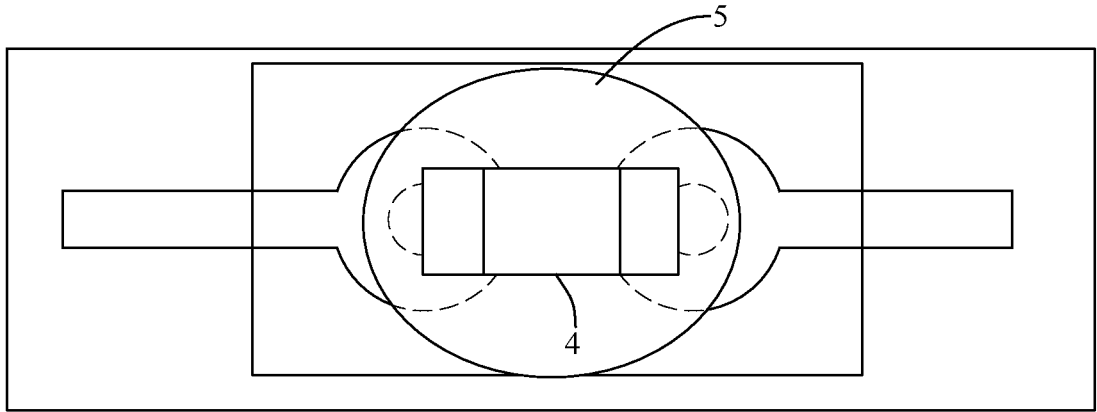
FIG. 8 is a top view illustrating a surface-mounted electronic component being held by the non-conductive adhesive.
Figure 9:
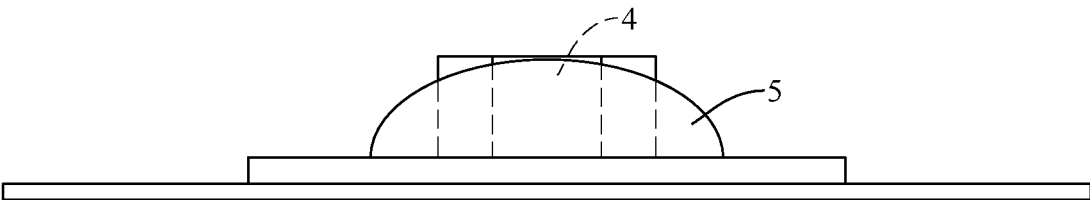
FIG. 9 is a side view illustrating the surface-mounted electronic component being held by the non-conductive adhesive.

In a subsequent step, referring to FIGS. 8 and 9, the replacement electronic component 4 is mounted to the non-conductive adhesive 5 to be firmly held by the non-conductive adhesive 5.

Figure 10:
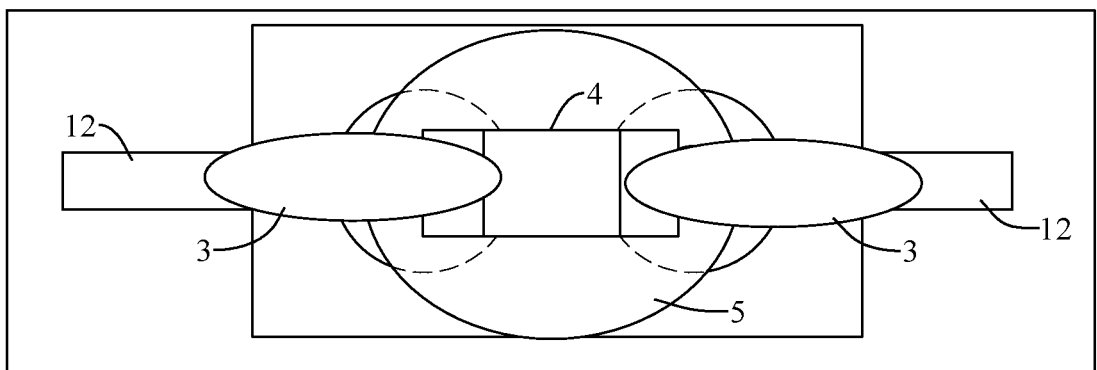
FIG. 10 is a top view illustrating conductive lumps being dispensed on the rework patch.
Figure 11:
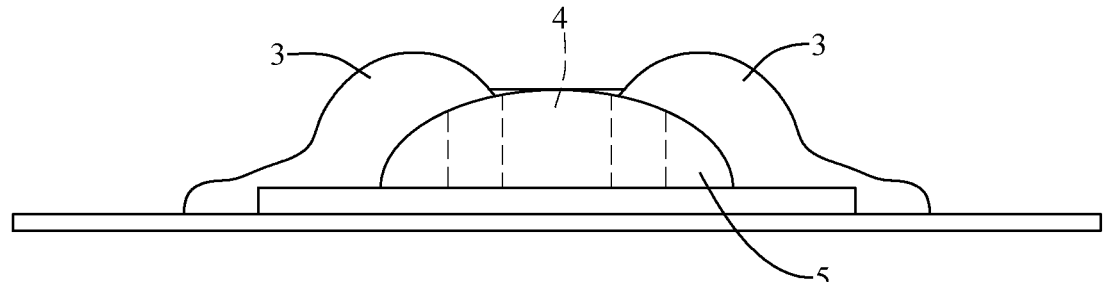
FIG. 11 is a side view illustrating the conductive lumps being dispensed on the rework patch.

Referring to FIGS. 10 and 11, next, a plurality of conductive lumps 3 are dispensed on the non-conductive adhesive 5 to establish an electrical connection between the replacement electronic component 4 and each of the board traces 12.

The alternative rework process is appropriate for the replacement electronic component 4 that has leads at an upper side thereof. The rework patch 2 provides similar advantages in the alternative rework process.

In implementations, a rework patch adapted for a rework process of an electronic circuit, the electronic circuit including a substrate, at least two spaced-apart board traces that are formed on the substrate, and at least one defect portion within at least one of the board traces, said rework patch comprising a flexible patch body adapted to be attached to the substrate to partially cover each of the board traces and to cover the defect portion; and at least two spaced-apart patch traces formed on said patch body, a pattern of said patch traces corresponding to a pattern of a portion of the board traces covered by said patch body, said patch traces being formed at one side of said patch body opposite to the substrate, and being adapted for connection with an electronic component.

In implementations, a method for a rework process of an electronic circuit, the electronic circuit including a substrate, at least two spaced-apart board traces that are formed on the substrate, and at least one defect portion within at least one of the board traces, the method comprising steps of: a) laminating a rework patch of claim 1 on to the substrate to partially cover each of the board traces and to cover the defect portion; and b) dispensing a plurality of conductive lumps on a periphery of the patch body to establish an electrical connection between each of the patch traces and a respective one of the board traces.

In implementations, a method for a rework process of an electronic circuit, the electronic circuit including a substrate, at least two spaced-apart board traces that are formed on the substrate, and at least one defect portion within at least one of the board traces, the method comprising steps of: e) laminating a rework patch of claim 1 on to the substrate to partially cover each of the board traces and to cover the defect portion; f) dispensing a non-conductive adhesive (NCA) on the rework patch to partially cover the patch traces; g) mounting an electronic component to the non-conductive adhesive to be firmly held by the non-conductive adhesive; and h) dispensing a plurality of conductive lumps on the non-conductive adhesive to establish an electrical connection between a replacement electronic component and each of the board traces.

In implementations, a rework patch adapted for a rework process of an electronic circuit, the electronic circuit including a substrate, at least two spaced-apart board traces that are formed on the substrate, and at least one defect portion within at least one of the board traces, said rework patch comprising a flexible patch body adapted to be attached to the substrate to partially cover each of the board traces and to cover the defect portion, said patch body being made of a non-conductive material; and at least two spaced-apart patch traces formed on said patch body, a pattern of said patch traces corresponding to a pattern of a portion of the board traces covered by said patch body, said patch traces being formed at one side of said patch body opposite to the substrate, and being adapted for connection with an electronic component.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:
1. A rework patch adapted for a rework process of an electronic circuit, the electronic circuit including a substrate, at least two spaced-apart board traces that are formed on the substrate, and at least one defect portion within at least one of the board traces, said rework patch comprising:

a flexible patch body adapted to be attached to the substrate to partially cover each of the board traces and to cover the defect portion; and at least two spaced-apart patch traces formed on said patch body, a pattern of said patch traces corresponding to a pattern of a portion of the board traces covered by said patch body, said patch traces being formed at one side of said patch body opposite to the substrate in direct connection with an electronic component, wherein said patch body is made of one of an ultraviolet (UV) acrylic hotmelt adhesive, flexible and/or stretchable Polydimethylsiloxane (PDMs), Silicon, and urethane based substrate.

2. The rework patch as claimed in claim 1, wherein said patch traces are screen printed/dispensed onto said patch body.

3. The rework patch as claimed in claim 1, wherein said patch body is attached to said substrate by using one of an infrared (IR) localized heater, a localized heater and a customized mini heat press.

4. The rework patch as claimed in claim 1, wherein the pattern of said patch traces is identical to the pattern of the portion of the board traces covered by said patch body except the defect portion.

5. A method for a rework process of an electronic circuit, the electronic circuit including a substrate, at least two spaced-apart board traces that are formed on the substrate, and at least one defect portion within at least one of the board traces, the method comprising steps of:

a) laminating a rework patch on to the substrate to partially cover each of the board traces and to cover the defect portion, wherein the rework patch includes:

a flexible patch body adapted to be attached to the substrate to partially cover each of the board traces and to cover the defect portion; and at least two spaced-apart patch traces formed on said patch body, a pattern of said patch traces corresponding to a pattern of a portion of the board traces covered by said patch body, said patch traces being formed at one side of said patch body opposite to the substrate, wherein said patch body is made of one of an ultraviolet (UV) acrylic hotmelt adhesive, flexible and/or stretchable Polydimethylsiloxane (PDMs), Silicon, and urethane based substrate;

b) dispensing a plurality of conductive lumps on a periphery of the patch body to establish an electrical connection between each of the patch traces and a respective one of the board traces; and c) forming an electrical connection between an electronic component and each of the patch traces.

6. The method as claimed in claim 5, further comprising, after step b), a step of:

c) dispensing a plurality of additional conductive lumps respectively on the patch traces for the electronic component to be mounted thereto.

7. The method as claimed in claim 5, wherein the patch traces are screen printed/dispensed onto the patch body.

8. The method as claimed in claim 5, wherein the rework patch is laminated on the substrate by using one of an infrared (IR) localized heater, a localized heater and a customized mini heat press.

9. The method as claimed in claim 5, wherein the pattern of the patch traces is identical to the pattern of the portion of the board traces covered by said patch body except the defect portion.

10. The method as claimed in claim 5, further comprising, before step a), a step of:

d) cleaning the substrate by using a cleaning agent/solvent.

11. A method for a rework process of an electronic circuit, the electronic circuit including a substrate, at least two spaced-apart board traces that are formed on the substrate, and at least one defect portion within at least one of the board traces, the method comprising steps of:

e) laminating a rework patch on to the substrate to partially cover each of the board traces and to cover the defect portion, wherein the rework patch includes:

a flexible patch body adapted to be attached to the substrate to partially cover each of the board traces and to cover the defect portion; and at least two spaced-apart patch traces formed on said patch body, a pattern of said patch traces corresponding to a pattern of a portion of the board traces covered by said patch body, said patch traces being formed at one side of said patch body opposite to the substrate, wherein said patch body is made of one of an ultraviolet (UV) acrylic hotmelt adhesive, flexible and/or stretchable Polydimethylsiloxane (PDMs), Silicon, and urethane based substrate;

f) dispensing a non-conductive adhesive (NCA) on the rework patch to partially cover the patch traces;

g) mounting an electronic component to the non-conductive adhesive to be firmly held by the non-conductive adhesive; and h) dispensing a plurality of conductive lumps on the non-conductive adhesive to establish an electrical connection between a replacement electronic component and each of the board traces.

12. The method as claimed in claim 11, wherein the patch traces are screen printed/dispensed onto the patch body.

13. The method as claimed in claim 11, wherein the rework patch is laminated on the substrate by using one of an infrared (IR) localized heater, a localized heater and a customized mini heat press.

14. The method as claimed in claim 11, wherein the pattern of the patch traces is identical to the pattern of the portion of the board traces covered by said patch body except the defect portion.

15. A rework patch adapted for a rework process of an electronic circuit, the electronic circuit including a substrate, at least two spaced-apart board traces that are formed on the substrate, and at least one defect portion within at least one of the board traces, said rework patch comprising:

a flexible patch body adapted to be attached to the substrate to partially cover each of the board traces and to cover the defect portion, said patch body being made of a non-conductive material; and at least two spaced-apart patch traces formed on said patch body, a pattern of said patch traces corresponding to a pattern of a portion of the board traces covered by said patch body, said patch traces being formed at one side of said patch body opposite to the substrate in direct connection with an electronic component, wherein said patch body is made of one of an ultraviolet (UV) acrylic hotmelt adhesive, flexible and/or stretchable Polydimethylsiloxane (PDMs), Silicon, and urethane based substrate.

\* \* \* \* \*